(12) United States Patent
Naito et al.

(10) Patent No.: US 7,147,714 B2
(45) Date of Patent: Dec. 12, 2006

(54) MANUFACTURING METHOD OF SILICON CARBIDE SINGLE CRYSTALS

(75) Inventors: Masami Naito, Inazawa (JP); Kazukuni Hara, Kasugai (JP); Fusao Hirose, Obu (JP); Shoichi Onda, Toyokawa (JP)

(73) Assignee: Denso Corporation, Kariya (JP)

( * ) Notice: Subject to any disclaimer, the term of this patent is extended or adjusted under 35 U.S.C. 154(b) by 88 days.

(21) Appl. No.: 10/832,396

(22) Filed: Apr. 27, 2004

(65) Prior Publication Data
US 2004/0194693 A1 Oct. 7, 2004

Related U.S. Application Data

(62) Division of application No. 10/006,135, filed on Dec. 10, 2001, now Pat. No. 6,746,787.

(30) Foreign Application Priority Data
Dec. 12, 2000 (JP) .............................. 2000-377485

(51) Int. Cl.
*C30B 23/00* (2006.01)
(52) U.S. Cl. ..................... 117/84; 117/88; 117/103; 117/906; 117/951
(58) Field of Classification Search .............. 117/84, 117/88, 103, 906, 951
See application file for complete search history.

(56) References Cited

U.S. PATENT DOCUMENTS

| 4,912,063 | A | | 3/1990 | Davis et al. |
| 5,679,153 | A | * | 10/1997 | Dmitriev et al. ............ 117/106 |
| 5,944,890 | A | * | 8/1999 | Kitou et al. ................. 117/101 |
| 6,153,165 | A | | 11/2000 | Tanino et al. |
| 6,153,166 | A | | 11/2000 | Tanino |
| 6,187,279 | B1 | | 2/2001 | Tanino et al. |
| 6,203,772 | B1 | | 3/2001 | Tanino et al. |
| 6,214,108 | B1 | * | 4/2001 | Okamoto et al. ............. 117/95 |
| 6,660,084 | B1 | * | 12/2003 | Shiomi et al. ............... 117/104 |
| 6,746,787 | B1 | * | 6/2004 | Naito et al. ................. 428/698 |
| 6,780,243 | B1 | * | 8/2004 | Wang et al. ................. 117/105 |

FOREIGN PATENT DOCUMENTS

| EP | 0916749 A1 * | 5/1999 |
| JP | A-H10-036194 | 2/1998 |
| JP | A-H10-261615 | 9/1998 |
| JP | A-2000-34198 | 2/2000 |

OTHER PUBLICATIONS

Kamata et al., "Migration of shifting in epitaxial growth of thick 4H-SiC," *Abstract of the Lecture of $47^{th}$ Japan Society of Applied Physics Related Association*, separate vol. 1, p. 407, No. 29p-YF-6, Mar. 2000. (Discussed on p. 2 of the spec.).

(Continued)

*Primary Examiner*—Robert Kunemund
*Assistant Examiner*—G. Nagesh Rao
(74) *Attorney, Agent, or Firm*—Posz Law Group, PLC

(57) ABSTRACT

When a SiC substrate is heated up to around 1800°C., sublimation of SiC occurs from the SiC substrate. Moreover, temperature of the front surface of the SiC substrate is lower than that of the back surface of the SiC substrate. Therefore, sublimation gas sublimed from a back-surface vicinity of the substrate, where temperature is high, moves to a front-surface vicinity of the substrate, where temperature is low, through the hollow micro-pipe defect. Epitaxial growth proceeds on the front surface of the substrate while the sublimation gas is recrystallized at the front-surface vicinity of the substrate, so that the micro-pipe defect is occluded.

23 Claims, 5 Drawing Sheets

OTHER PUBLICATIONS

Search Report dated Jul. 5, 2006 from European Patent Office for counterpart application of 01129641.5-2122.

Yakimova R. et al, "Current status and advances in the growth of Sic," Diamond and Related Materials, Elsevier Science Publishers, vol. 9, No. 3-6, Apr. 2000, pp. 432-438.

Tsuchida H et al., "LPCVD Growth and Structural Properties of 4H-SiC Epitaxial Layers," Materials Science Forum, vol. 338-342, Mar. 2000, pp. 145-148.

Rowell J A et al., "Process-Induced Morphological Defects in Epitaxial CVD Silicon Carbide," Physica Status Solidi B, vol. 202, Jul. 1997, pp. 529-548.

Carter Jr. et al., "Progress in SiC: from material growth to commercial device development," Materials Science and Engineering B, Elsevier Science Publishers, vol. 61-62, Jul. 1999, pp. 1-8.

A. Ellison et al., "Fast SiC Epitaxial Growth in a Chimney CVD Reactor and HTCVD Crystal Growth Developments," Materials Science Forum, vol. 338-342, Mar. 2000, pp. 131-136.

Saddow S E et al., "Silicon carbide CVD homoepitaxy on wafers with reduced microscope density," Materials Science and Engineering B, Elsevier Science Publishers, vol. 61-62, Jul. 1999, pp. 158-160.

* cited by examiner

MANUFACTURING METHOD OF SILICON CARBIDE SINGLE CRYSTALS

CROSS REFERENCE TO RELATED APPLICATION

This application is a divisional application of U.S. patent application Ser. No. 10/006,135 filed on Dec. 10, 2001, now U.S. Pat. No. 6,746,787, which is based on Japanese Patent Application No. 2000-377485 filed on Dec. 12, 2000, the contents of which are incorporated herein by reference.

DETAILED DESCRIPTION OF THE INVENTION

1. Field of the Invention

The present invention relates to manufacturing method of a single-crystal silicon carbide (SiC), especially to a method capable of restraining a micro-pipe as a crystal defect from being inherited.

2. Related Art

Heretofore, SiC single crystals are generally produced by sublimation method, however, hollow penetrating holes called micro-pipe defects (hollow penetrating defects) are formed at a degree of 100 to 1000 pieces/cm$^2$.

In a case where a power device or a high frequency device is formed, an epitaxial film, which becomes regions to form devices, is formed so as to have a structure suitable for the devices using these single crystals as a substrate. When the defects exist in the substrate, the defects are inherited into the epitaxial film which is grown on the substrate, so that defects which are in the same number of the micro-pipe defects are formed in the epitaxial film. Further, when the devices are formed in this epitaxial film with these defects, the fact is reported that leak current of the devices increases while backward withstand voltage decreases. Therefore, it is very important to reduce the defects in producing the devices.

As a method for reducing the micro-pipe defects in the epitaxial film in which devices are formed, recently, methods for eliminating the micro-pipe defects in the SiC single crystals as the substrate has been proposed. The methods are disclosed in U.S. Pat. No. 5,679,153, JP-A-10-324600, JP-A-2000-44398, and "Study on dislocations of 4H-SiC thick layer grown by CVD" (The Lecture of the 47th Japan Society of Applied Physics Related Association, Abstracts of the lecture, separate volume 1, page 407, No. 29P-YF-6, Kamata et al., March, 2000, Central Research Institute of Electric Power Industry).

According to the method in U.S. Pat. No. 5,679,153, when crystals are grown by liquid crystal epitaxy technique using melted SiC in silicon, an epitaxial film in which micro-pipe defects are reduced is grown on a seed substrate having micro-pipes.

Next, according to the method in JP-A-10-324600, formation of a polycrystalline film of a β(cubic)-SiC or α(hexagonal)-SiC on a surface of an α-SiC single crystal substrate (seed crystal) by thermal chemical vapor deposition (CVD) and thermal treatment of the composite body resulting from the formation are repeated a plurality of times so that a plurality of α-SiC or β-SiC polycrystalline films are oriented (the kind of solid phase epitaxial growth) in the same direction of the crystal axis of the α-SiC single crystal substrate (seed crystal). Thus, SiC single crystals are formed so as to have few micro-pipe defects.

On the other hand, according to JP-A-2000-44398, after a coating material is coated on a single crystal substrate having micro-pipes, thermal treatment is conducted to occlude the micro-pipe defects in the SiC substrate that exist in the SiC substrate, so that a crystal in which at least a part of the micro-pipe defects are occluded is obtained.

Further, according to the Abstracts in The Lecture of the 47th Japan Society of Applied Physics Related Association, the fact is reported that an epitaxial film is formed on a substrate in a thickness of 65 μm at a rate of 16 μm/h, so that micro-pipes are occluded.

According to the above-described first method, the epitaxial film should be grown to a thickness of about 20 to 75 μm or more by the liquid phase epitaxy method, to obtain a region where the micro-pipes are eliminated. Moreover, an epitaxial film on which devices are formed is formed on the epitaxial film by liquid phase epitaxy by a CVD method, so that a number of manufacturing processes increase.

According to the above-mentioned second method, SiC composite is obtained so as to include crystal boundaries therein since the polycrystalline film is formed on the single crystal substrate. When the composite is subjected to the thermal treatment to cause the solid phase epitaxy on the seed crystal, there is possibility that crystal defects due to internal stress at the crystal boundaries in the polycrystalline film are introduced. These defects become sources of traps, and therefore there is a problem that this substrate is not suitable for a substrate to form devices. Moreover, the formation of the film, the thermal treatment, and a surface flattening should be repeated several times to grow a substrate having a practical thickness. Thus, manufacturing processes increase so that manufacturing cost becomes high.

According to the above-mentioned third method, at least the covering process with the coating material, the thermal treatment, and a surface flattening process that includes a removing process of the coating material are necessary, so that the manufacturing process increases.

According to the above-mentioned fourth method, although the micro-pipes are occluded by thickening the epitaxial film, a thickness of the epitaxial film to form devices on the substrate is about 20 to 30 μm at most. Therefore, there is a need that the micro-pipes are occluded even if the epitaxial film is thin. Besides, the growth rate is only about 16 μm/h. It takes many hours, i.e., 4 hours or more to occlude the micro-pipes. That is, this method is not suitable for a commercial use as a method for forming an epitaxial film for devices or bulk.

SUMMARY OF THE INVENTION

The present invention has been made in view of the above-mentioned problem, and an object thereof is to provide a technique for providing more practical occluding method of a micro-pipe in a silicon carbide substrate that has the micro-pipe.

According to a first aspect of the present invention, when an epitaxial film is formed on a silicon carbide substrate having a micro-pipe, temperature difference is applied between a front surface of the substrate and a back surface of the substrate that is disposed opposite to the front surface so that the front surface is at a low temperature.

By lowering the temperature at the front surface of the silicon carbide substrate as compared to the back surface, sublimation gas of SiC is generated at the vicinity of the back surface where the temperature is high (the micro-pipe or the back surface). The sublimated gas flows to a side of the front surface through the micro-pipe, and then recrystallized at the vicinity of the front surface where the temperature is low. At that time, the gas is recrystallized at an inside of the micro-pipe, so that an inner diameter of the micro-pipe becomes small, and finally, the micro-pipe can be occluded.

Incidentally, as described in a second aspect of the present invention, by setting a temperature of the substrate at 1650° C. or more, sublimation is apt to occur from the substrate, and occlusion of the micro-pipe is stimulated.

Moreover, as described in a third aspect of the present invention, by setting the temperature of the substrate at 1750° C. or more, sublimation is stimulated from the substrate, so that the micro-pipe is occluded easily. However, in a case where the temperature exceeds 1900° C., the sublimation is stimulated so that the sublimation and a recrystallization are balanced so as to restrain the occlusion of the micro-pipe. Therefore, the temperature of the silicon carbide substrate is preferably set to 1900° C. at most.

Moreover, as described in a fourth aspect of the present invention, since hydrogen gas or helium gas has a high heat-transmitting characteristic so as to effectively lower the temperature at the front surface of the silicon carbide substrate where the gas is supplied, so that the temperature difference between the front surface and the back surface of the substrate is sufficiently generated. Thus, the sublimation gas from the vicinity of the back surface of the silicon carbide substrate is transferred to the front surface.

Moreover, as described in a fifth aspect of the present invention, by setting a flow rate of the gas at 1 m/sec or more, the temperature at the front surface of the silicon carbide substrate where the gas is supplied is effectively lowered so that the temperature difference between the front surface and the back surface of the substrate is sufficiently generated. Thus, the sublimation gas from the vicinity of the back surface of the silicon carbide substrate is transferred to the front surface.

Moreover, as described in a sixth or seventh aspect of the present invention, by setting the temperature difference between the front surface and the back surface of the silicon carbide substrate at 0.5, preferably, 5° C. or more, it can be encouraged that the gas sublimed at a side of the back surface is transferred, and recrystallized at the vicinity of the front surface. Thus, the micro-pipe can be occluded easily.

Moreover, as described in a eighth aspect of the present invention, by setting a growth rate of the epitaxial film at 20 µm/h or more, a growth rate toward a lateral direction of a silicon carbide film on the micro-pipe can be enhanced, so that the occlusion of the micro-pipe can be shortened.

Moreover, as described in a ninth aspect of the present invention, when a thickness of the silicon carbide substrate is at 300 µm or more, the temperature at the front surface of the substrate where the gas is supplied is effectively lowered, whereby the temperature difference between the front surface and the back surface of the substrate is sufficiently generated. Thus, it is encouraged that the sublimation gas from the back surface is transferred to the front surface.

Moreover, as described in a tenth aspect of the present invention, by setting flow direction of a gas containing carbon and a gas containing silicon in approximately perpendicular to a front surface of the substrate that exposes an opening of said micro-pipe, a gas sublimed through the micro-pipe from the back surface is prevented from flowing out to the front surface. Therefore, it is encouraged that the sublimed gas is recrystallized at the vicinity of the opening. Thus, the micro-pipe can be occluded easily.

Moreover, as described in an eleventh aspect of the present invention, by setting a temperature of the substrate at 1650° C. or more, sublimation is apt to occur from the substrate, so that the micro-pipe can be easily occluded.

Moreover, as described in a twelfth aspect of the present invention, by preferably setting the temperature of the substrate at 1750 to 1900° C., sublimation is encouraged from the substrate, so that the micro-pipe is occluded easily. The reason why the temperature is set at 1900° C. or less is that the sublimation is more encouraged as compared to the recrystallization at over 1900° C., and therefore heating up over 1900° C. is not preferable.

Furthermore, as described in a thirteenth aspect of the present invention, the micro-pipe penetrates the substrate from the front surface to the back surface, and the substrate is held so as to closely contact a contacting member at the back surface thereof, so that the sublimed gas from the micro-pipe at the vicinity of the back surface is apt to move to the front surface, whereby the sublimed gas is encouraged to be recrystallized at the vicinity of the front surface. Thus, the micro-pipe can be easily occluded.

Moreover, as described in a fourteenth aspect of the present invention, the substrate is held so that pressure of an atmosphere contacting the back surface is high as compared to that of an atmosphere contacting the front surface. As a result, the sublimed gas from the micro-pipe at the vicinity of the back surface is apt to move to the front surface, whereby the sublimed gas is encouraged to be recrystallized at the vicinity of the front surface. Thus, the micro-pipe can be easily occluded.

Moreover, as described in a fifteenth aspect of the present invention, by reducing the pressure in the epitaxial growth, the pressure at the vicinity of the back surface of the substrate is lowered through the micro-pipe, so that the sublimation of silicon carbide is encouraged. Thus, the micro-pipe can be easily occluded.

Moreover, as described in a sixteenth aspect of the present invention, when an opening of the micro-pipe is enlarged in the silicon carbide substrate, a plurality of steps are formed at the opening. Since the steps are cores, a lateral growth of a silicon carbide film progresses, and therefore the micro-pipe can be easily occluded.

Moreover, as described in a seventeenth aspect of the present invention, by heating up the SiC substrate to 1650° C. or more in hydrogen, the front surface of the silicon carbide substrate is etched. Specifically, an etching in the vicinity of defects is encouraged, so that the opening of the micro-pipe can be enlarged. Successively, by supplying a gas containing carbon and a gas containing silicon, the epitaxial film can be grown by epitaxial growth.

Moreover, as described in an eighteenth aspect of the present invention, by supplying a gas containing chlorine, the front surface of the silicon carbide substrate is etched. Specifically, an etching in the vicinity of defects is encouraged, so that the opening of the micro-pipe can be enlarged. Successively, by supplying a gas containing carbon and a gas containing silicon, the epitaxial film can be grown by epitaxial growth.

Moreover, as described in a nineteenth aspect of the present invention, by etching the silicon carbide substrate using KOH, the etching in the vicinity of the defects is encouraged, so that the opening of the micro-pipe can be enlarged.

Moreover, as described in a twentieth aspect of the present invention, when an enlarged diameter in the opening of the micro-pipe has a size of twice or more as large as that before enlarged, the gas can be supplied sufficiently, so that the growth at the opening is encouraged. The micro-pipe can be easily occluded since a plurality of steps can be formed at the opening, and a growth of a silicon carbide film in a lateral direction progresses while the steps serve as cores.

Incidentally, as described in a twenty-first aspect of the present invention, the silicon carbide substrate, on which the silicon carbide film is formed by the epitaxial growth in a chamber, serves as a seed crystal, and a sublimation gas sublimed from a source material is generated in the chamber. Then, the sublimation gas is sublimed on the seed crystal.

Moreover, as described in a twenty-second aspect of the present invention, by forming the epitaxial film on a silicon carbide substrate having a micro-pipe with an opening whose diameter increases as being close to a front surface of said substrate, a substrate can be obtained, in which the silicon carbide epitaxial film is not opened on the micro-pipe. Therefore, a high quality silicon carbide single crystal substrate which has less micro-pipe is produced. Besides, the micro-pipe is occluded (or terminated) in this silicon carbide substrate, which can be an advantage for producing devices since a thickness of the epitaxial film is usually considered in producing the devices without considering a location of the micro-pipe.

Incidentally, as described in a twenty-third aspect of the present invention, a diameter of the opening, which is enlarged at a surface of an opening of the substrate, is preferably twice or more as large as that of the opening at a bottom of the opening of the substrate.

Moreover, as described in a twenty-fourth aspect of the present invention, when the micro-pipe is occluded (or terminated) at a conductive region disposed between the silicon carbide substrate body and the epitaxial film, and the devices are formed in this substrate, in a case where a voltage is applied so as to expand a depletion layer, the depletion layer that is expanded from the epitaxial layer is restrained from being expanded by the conductive region so that the depletion layer is prevented from reaching the micro-pipe. Therefore, electric field concentration at the micro-pipe, which is caused by the phenomenon in which the depletion layer reaches the micro-pipe, is suppressed so that a breakdown due to the micro-pipe can be prevented.

Incidentally, the conductive region is regarded as a region where an impurity concentration is high in comparison with a predetermined epitaxial film.

Moreover, as described in a twenty-fifth aspect of the present invention, the conductive region may be a conductive substrate, or as described in a twenty-sixth aspect of the present invention, the conductive region may exist in the epitaxial film.

Otherwise, as described in a twenty-seventh aspect of the present invention, the conductive region is a low resistivity epitaxial film. In this case, the depletion layer expanding from a high resistivity epitaxial film formed on the low resistivity epitaxial film is restrained from expanding by the low resistivity epitaxial film. As a result, the breakdown due to the micro-pipe is prevented.

Other objects, features and advantages of the present invention will become more apparent from the following detailed description made with reference to the accompanying drawings.

DETAILED DESCRIPTION OF THE PREFERRED EMBODIMENTS

Hereinafter, an embodiment adopting the present invention will be explained. The present embodiment adopts the present invention to a method for producing an epitaxial film for forming a device such as a field effect transistor (MOSFET or the like), a junction field effect transistor (JFET), or a Schottky barrier diode on a silicon carbide single crystal substrate (SiC single crystal substrate) which is produced by, for example, sublimation.

(First Embodiment)

Figure 1:
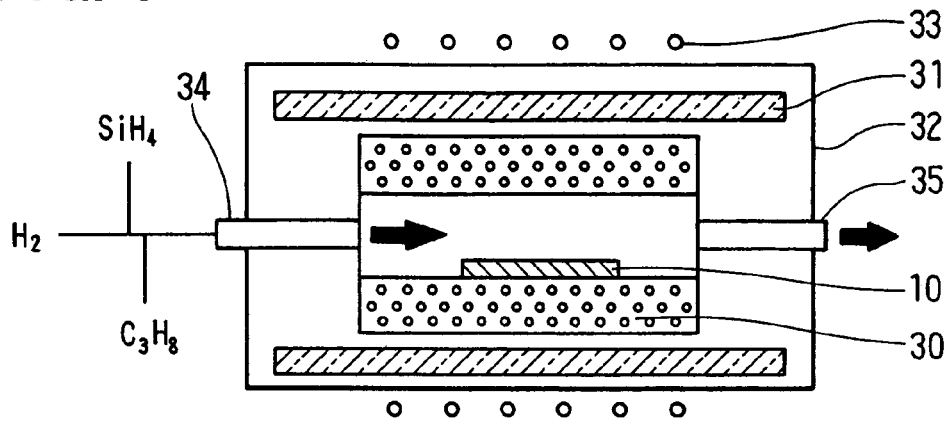
FIG. 1 is a schematic view of a CVD apparatus for growing a SiC epitaxial film in the first embodiment.

FIG. 1 shows a schematic view of a (Chemical Vapor Deposition) (CVD) apparatus for forming an epitaxial film on a SiC single crystal substrate 10. The SiC single crystal substrate 10 is disposed in a susceptor 30 composed of carbon and having a cylinder shape. The susceptor 30 is surrounded by a heat insulator 31 so as to prevent heat radiated from the heated-up susceptor from leaking out to the outside. Moreover, the susceptor 30 and the heat insulator 31 are surrounded by a reactor 32 which is composed of quartz. A coil 33 is disposed at a periphery of that so that the susceptor 30 is heated up by high frequency induction heating.

Hydrogen gas, $SiH_4$ gas and $C_3H_8$ gas are supplied through respective conduits, and are mixed up with each other just before a gas introducing conduit 34, and then supplied into the reactor 32 from the gas introduction conduit 34. Exhaust is conducted by a rotary pump, which is not shown, through a gas exhausting conduit 35.

Hereinafter, an example in which epitaxial growth is performed in this apparatus will be explained using FIGS. 2A–3B.

Figure 2A:
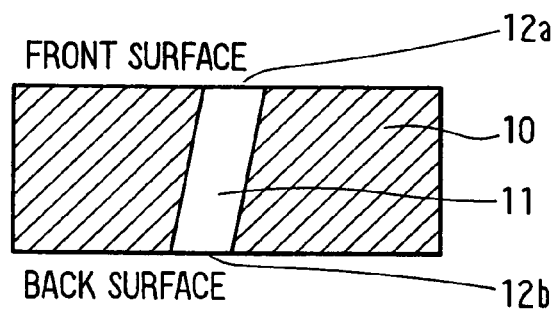
FIGS. 2A to 2C are cross sectional views showing epitaxial growth process in the first embodiment, respectively.

First, a 6H-SiC single crystal substrate 10 is provided as the SiC single crystal substrate, which has an off-surface inclined at 3.5 degrees from a (0 0 0 1) surface, and has a thickness of 700 μm (FIG. 2A). In this case, since a micro-pipe defect 11 extends in a direction of <0 0 0 1> axis, the micro-pipe defect 11 is inclined with respect to a front surface of the SiC substrate 10. This substrate 10 is disposed on the susceptor 30 and inserted into the reactor 32 of the CVD apparatus.

Figure 2B:
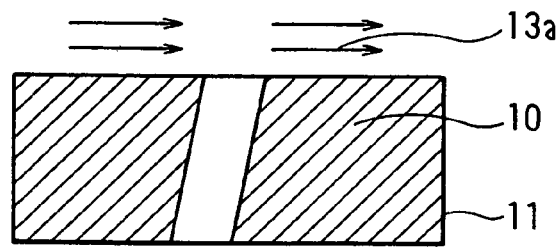

Further, the substrate 10 is heated up to 1800° C. while hydrogen is flowed as a carrier gas 13a at a reduced pressure of, for example, 200 Torr (FIG. 2B). At that time, a back surface of the substrate 10 contacts the susceptor while the front surface of the substrate 10 is subjected to hydrogen. Besides, flow rate of hydrogen is faster, such as 1 m/sec or more in the reduced pressure of 200 Torr. Therefore, heat is apt to be taken away from the front surface of the substrate 10, so that temperature at the front surface is kept low.

Incidentally, temperature of the substrate 10 is regarded as temperature of the susceptor 30 which is measured by a pyrometer.

After the temperature of the substrate 10 reaches 1800° C., a mix gas, in which the $SiH_4$ gas and $C_3H_8$ gas as source gases are added to the hydrogen gas, is introduced, so that a SiC epitaxial film 14 is grown on the front surface of the substrate 10. Incidentally, a flow of the hydrogen gas is at 10 liters/min.

At high temperature of 1800° C., sublimation of SiC occurs from the SiC substrate 10 so that sublimation gas 10a such as $Si_2C$, $SiC_2$ and the like is generated. Moreover, temperature of the front surface of the substrate is lower than that of the back surface of the substrate. Therefore, sublimation gas sublimed from a back-surface vicinity 12b of the substrate, where temperature is high, moves to a front-surface vicinity 12a of the substrate, where temperature is low, through the micro-pipe defect 11 which is hollow.

Figure 2C:
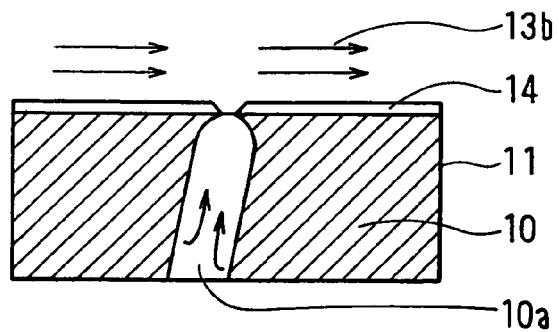

Meanwhile, at the front surface of the substrate 10, the source gases flow with the hydrogen. By thermal decomposition of the source gases, a plurality of Si atoms and a plurality of C atoms exist at the front surface of the substrate 10 to form the epitaxial film, so that the sublimation gas sublimed from the vicinity of the back surface of the substrate 10 is not apt to diffuse from the front surface to the outside of the substrate 10, whereby the sublimation gas is recrystallized on an inner wall of the micro-pipe defect that is disposed at the vicinity of the front surface of the substrate 10 (FIG. 2C).

Moreover, an epitaxial film 14 grows in a direction of an a-axis perpendicular to a thickness direction of the substrate 10 (perpendicular to a <0 0 0 1> axis), and therefore, grows on a recrystallized region on the micro-pipe defect 11 to encourage an occlusion of the micro-pipe defect 11.

Figure 3A:
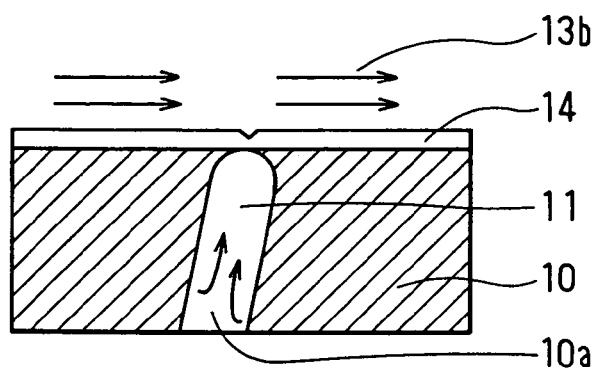
FIGS. 3A and 3B are cross sectional views showing epitaxial growth process in the first embodiment, respectively.
Figure 3B:
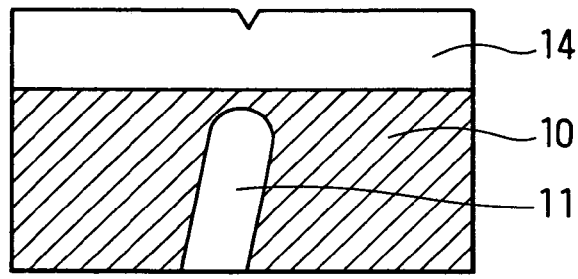

As time passes, crystals increases which are recrystallized at the inner wall of the micro-pipe defect 11, at last, the micro-pipe defect 11 is occluded while the epitaxial film grows on that, so that the micro-pipe does not extend into the epitaxial film 14 (FIGS. 3A and 3B).

As described above, in this embodiment, the front surface is cooled down as compared with the back surface of the substrate 10 by flowing reaction gases for epitaxial growth at a predetermined rate, and the sublimation gas sublimed at the vicinity of the back surface of the substrate 10 is recrystallized at a front surface side. By utilizing this phenomenon, the micro-pipe defect 11 can be occluded.

The SiC substrate 10 is thick, such as 700 μm, it is easy to cause a temperature difference between the front surface and the back surface of the substrate 10.

Moreover, since the flow rate is fast, growth rate is high, such as 50 μm/h. Even if a thickness of the epitaxial film is 10 μm, the micro-pipe 11 can be occluded at the front surface of the SiC substrate 10 without being absorbed into the epitaxial film.

Incidentally, a direction of the gas flow and a disposed orientation of the substrate are not limited to the case shown in FIG 1. The front surface of the substrate may be oriented to a lower side. Moreover, the gases may flow in an up-and-down direction and the front surface of the substrate is disposed in parallel with the flow.

(Second Embodiment)

Figure 4:
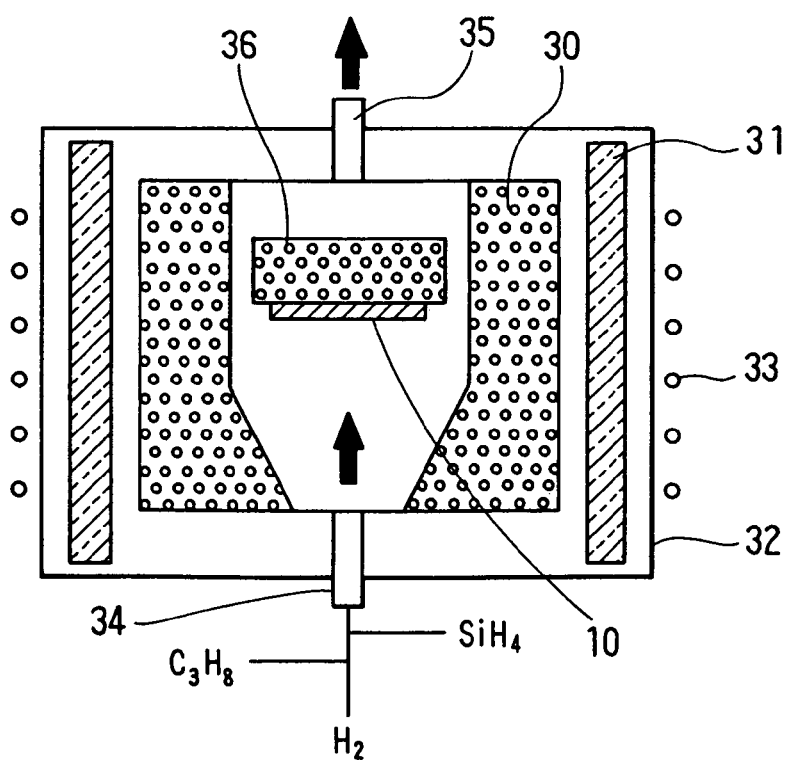
FIG. 4 is a schematic view of a CVD apparatus for growing a SiC epitaxial film in the second embodiment.

FIG. 4 shows a schematic view of a CVD (Chemical vapor Deposition) apparatus for forming an epitaxial film on a SiC single crystal substrate 10. The SiC single crystal substrate 10 is disposed in a susceptor 30 composed of carbon and having a cylinder shape. In this apparatus, the SiC substrate 10 is disposed so that a front surface thereof faces a lower side. The SiC substrate 10 is adhered to a pedestal 36 composed of carbon to be fixed. Incidentally, although not shown in the figure, the pedestal 36 is fixed to the susceptor 30. The pedestal 36 serves as a member for heating the substrate 10 and equalizing heat as well as for fixing of the SiC substrate 10.

The susceptor 30 is surrounded by a heat insulator 31 so as to prevent heat radiated from the heated-up susceptor from leaking out to the outside. Moreover, all of them are surrounded by a reactor 32 which is composed of quartz. A coil 33 is disposed at a periphery of that so that the susceptor 30 is heated up by high frequency induction heating.

Hydrogen gas, $SiH_4$ gas and $C_3H_8$ gas are supplied through respective conduits, and are mixed up with each other just before a gas introducing conduit 34, and then supplied into the reactor 32 from the gas introduction conduit 34. Exhaust is conducted by a rotary pump which is not shown through a gas exhausting conduit 35.

Hereinafter, an example in which epitaxial growth is performed in this apparatus will be explained using FIGS. 5A–6B. Conditions for growth are the same as the first embodiment.

Figure 5A:
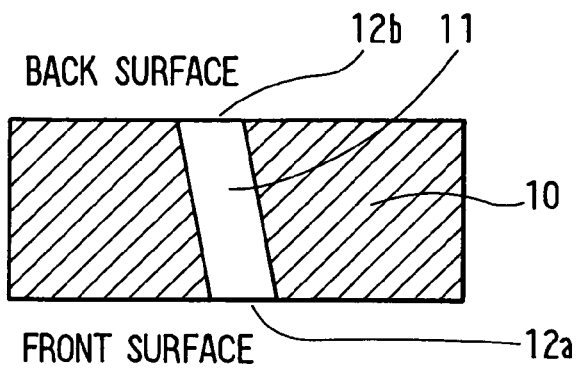
FIGS. 5A and 5B are cross sectional views showing epitaxial growth process in the second embodiment, respectively.

First, a 4H-SiC single crystal substrate is provided, which has an off-surface inclined at 8 degrees from a (0 0 0 1) surface, and has a thickness of 300 μm (FIG. 5A).

Figure 5B:
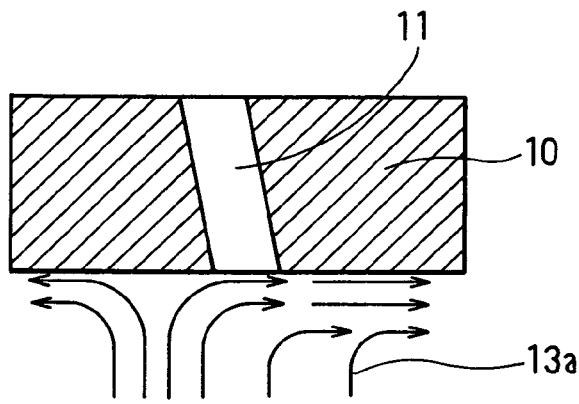

Further, the substrate 10 is heated up to 1800° C. while hydrogen is flowed as a carrier gas 13a at a reduced pressure of, for example, 200 Torr (FIG. 5B). At that time, a back surface of the substrate 10 contacts the susceptor while the front surface of the substrate is subjected to hydrogen. Besides, flow rate of hydrogen is faster, such as 1 m/sec or more in the reduced pressure of 200 Torr. Therefore, heat is apt to be taken away from the front surface of the substrate 10, so that temperature at the front surface is kept low.

After the temperature of the substrate 10 reaches 1800° C., a mix gas in which the $SiH_4$ gas and $C_3H_8$ gas as source gases are added to the hydrogen gas is flowed, so that a SiC epitaxial film 14 is grown on the front surface of the substrate 10. Incidentally, a flow of the hydrogen gas is at 10 liters/min.

At high temperature of 1800° C., sublimation of SiC occurs from the SiC substrate 10. Moreover, temperature of the front surface of the substrate is lower than that of the back surface of the substrate. Therefore, sublimation gas sublimed from a back-surface vicinity 12b of the substrate, where temperature is high, moves to a front-surface vicinity 12a of the substrate, where temperature is low, through the micro-pipe defect 11 which is hollow.

Figure 6A:
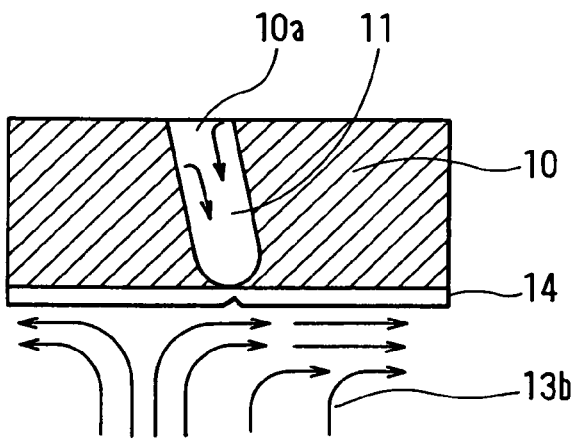
FIGS. 6A and 6B are cross sectional views showing epitaxial growth process in the second embodiment, respectively.
Figure 6B:
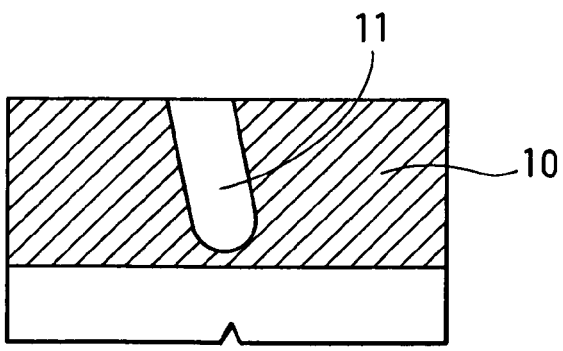

Meanwhile, at the front surface of the substrate 10, the source gases flow with the hydrogen toward the substrate, so that the sublimation gas sublimed from the vicinity of the back surface of the substrate 10 cannot exit from the front surface to the outside of the substrate 10. Therefore, recrystallization on an inner wall of the micro-pipe defect 11 at the vicinity of the front surface is possible. As time passes, the number of crystals that are recrystallized at the inner wall of the micro-pipe defect 11 increases. Finally, the micro-pipe defect 11 is occluded while the epitaxial film grows on the micro-pipe defect, so that the micro-pipe does not extend in the epitaxial film 14 (FIGS. 6A and 6B).

Incidentally, a direction of the gas flow and a disposed orientation of the substrate are not limited to the case shown in FIG. 4. The gases may flow from an upper side and the front surface of the substrate may be oriented the upper side.

(Third Embodiment)

In this embodiment, similarly to the above-mentioned second embodiment, another example in which epitaxial growth is performed in the apparatus shown in FIG. 4 will be explained using FIGS. 7A–8B.

Figure 7A:
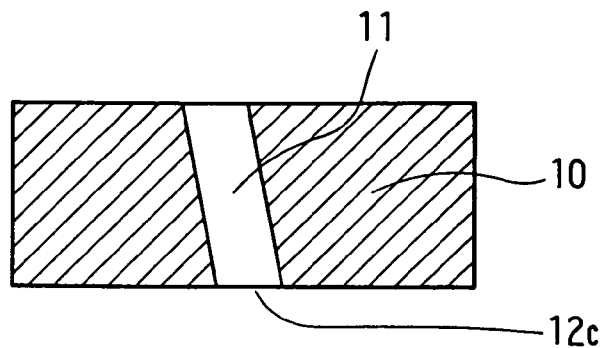
FIGS. 7A and 7B are cross sectional views showing epitaxial growth process in the third embodiment, respectively.

First, a 6H-SiC single crystal substrate is provided, which has an off-surface inclined at 3.5 degrees from a (0 0 0 1) surface. The substrate is disposed in a susceptor 30, and inserted in the reactor of the CVD apparatus (FIG. 7A).

Figure 7B:
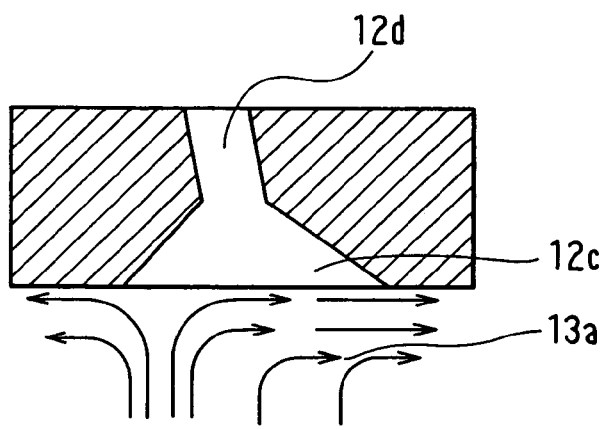

Further, the substrate 10 is heated up to 1800° C. while hydrogen is flowed as a carrier gas 13a at a reduced pressure of, for example, 200 Torr (FIG. 5B), and the substrate 10 is kept at that condition for 10 minutes. At that time, defect is selectively etched by exposing a front surface of the substrate to hydrogen at high temperature of approximately 1800° C., so that an opening 12c of a micro-pipe 11 that is located at the front surface as shown in FIG. 7B is enlarged in comparison with a diameter of the micro-pipe (a bottom of the opening 12c). As a result, the micro-pipe has a pipe portion 12d and the opening portion 12c therein. Preferably, a diameter of the opening 12c at a top thereof is twice or more as large as that at a bottom thereof where the pipe portion 12d is connected.

Figure 8A:
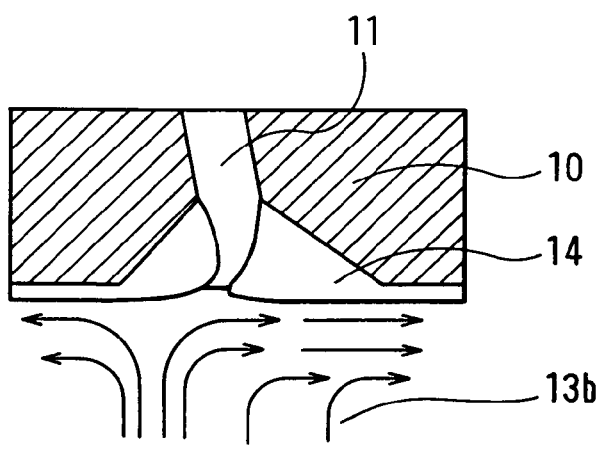
FIGS. 8A and 8B are cross sectional views showing epitaxial growth process in the third embodiment, respectively.
Figure 8B:
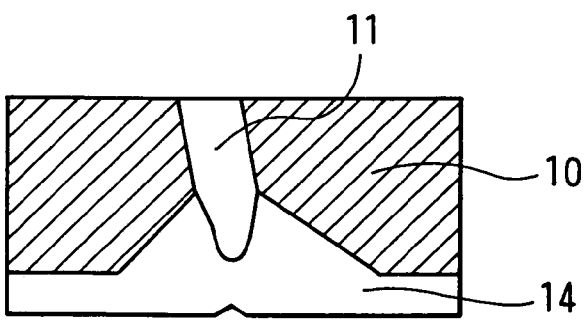

After that, $SiH_4$ gas and $C_3H_8$ gas as source gases are introduced to form a SiC epitaxial film 14 on the front surface of the substrate. At that time, the epitaxial film 14 grows while a growth in a lateral direction progresses. The growth is faster than that on the front surface; due to a synergistic effect in which a plurality of steps is are formed at an enlarged opening as cores for growth, and a surface of the opening approximates the a-surface from a face orientation of the front surface. As a result, a thickness of the epitaxial film becomes thicker, and finally the micro-pipe 11 is occluded, and the epitaxial film grows on the micro-pipe 11. Therefore, the micro-pipe defect 11 is not absorbed into the epitaxial film (FIGS. 8A and 8B).

Further, in this embodiment, similar to the second embodiment, the micro-pipe defect 11 is occluded by a sublimation gas of SiC.

Incidentally, as a method for forming the opening at the surface of the micro-pipe defect 11, a gas containing chlorine instead of hydrogen may be introduced to obtain a similar effect. In a case where chlorine is employed, it is unnecessary to heat up the substrate. In the case where hydrogen is employed, it is preferable that the substrate is heated up to 1650° C. or more. This is because etching effect by using hydrogen is not apt to appear at low temperatures and therefore it takes long time to enlarge the opening at the surface of the micro-pipe defect 11.

Also, in a case where a SiC single crystal substrate is etched in a KOH solution at approximately 500° C., the substrate is disposed in the CVD apparatus, and SiC epitaxial growth is conducted, the similar effect is obtained.

(Other embodiment)

Although the embodiments of the present invention are described above, the occlusion of the micro-pipe defect is not necessarily achieved in the SiC substrate 10 in in order to produce devices. In this embodiment, as another example shown in FIGS. 9A and 9B, an occluded location of micro-pipe defect will be explained in view of a relation between a withstand voltage of the devices and the micro-pipe defect.

When a depletion layer reaches the micro-pipe defect, a breakdown occurs. In this case, the breakdown voltage is lower than that expected. Therefore, it is preferable that the depletion layer does not reach the micro-pipe defect.

Figure 9A:
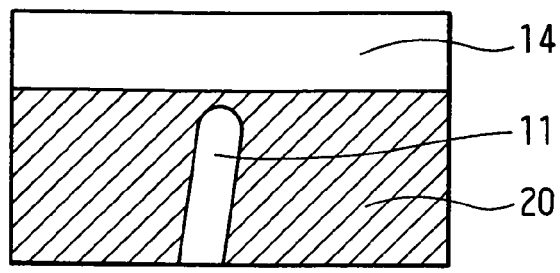
FIG. 9A is a cross sectional view of the SiC epitaxial growth substrate.

FIG. 9A shows a $n^+$-type low resistivity substrate 20 in which impurities are introduced at high concentration (for example, $10^{19}$ to $10^{20}/cm^3$) and on which a high resistivity, $n^-$-type epitaxial film 14 is formed by method described above.

FIG. 9A shows the low resistivity substrate 20 on the $n^-$-type epitaxial film 14 having a low impurity concentration. In this case, when a p-type region is formed in or on the $n^-$-type epitaxial film 14 to serve as a device, and when a reverse bias is applied to a p-n junction formed in the substrate, there may be a case where the depletion layer expands to penetrate the $n^-$-type epitaxial film 14 and reach the SiC substrate 20. Since an impurity concentration of the SiC substrate 20 is high, the depletion layer hardly expands in the SiC substrate 20.

Therefore, when the micro-pipe defect 11 is occluded in the SiC substrate 20, the depletion layer does not reach the micro-pipe defect 11, and therefore the breakdown due to the micro-pipe defect 11 is prevented from occurring.

Figure 9B:
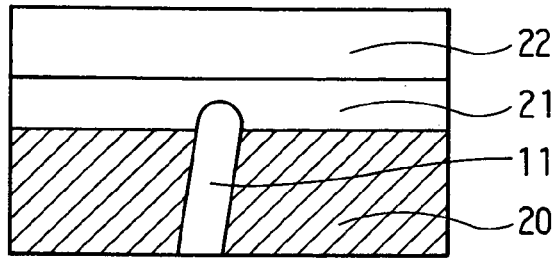
FIG. 9B is a cross sectional view of the SiC epitaxial growth substrate in the other embodiment.

Moreover, FIG. 9B shows the $n^+$-type low resistivity substrate 20 on which a low resistivity $n^+$-type epitaxial film 21 similar to the substrate 20 is formed, and a high resistivity, $n^-$-type epitaxial film 22 is formed on the low resistivity $n^+$-type epitaxial film 21.

A method in which the $n^+$-type epitaxial film 21 is formed at 1750° C. or less may be utilized to form the above structure. Also in this case, similar to the case shown in FIG. 9A, it is preferable that the micro-pipe defect 11 is occluded in the low resistivity region since the micro-pipe defect 11 may not influence the withstand voltage.

Namely, preferably, the micro-pipe defect should be occluded in a conductive low resistivity region. Incidentally, the word "conductive" means a low resistivity region to which impurities are introduced to such a degree that this region can serve as a conductor.

Figure 10A:
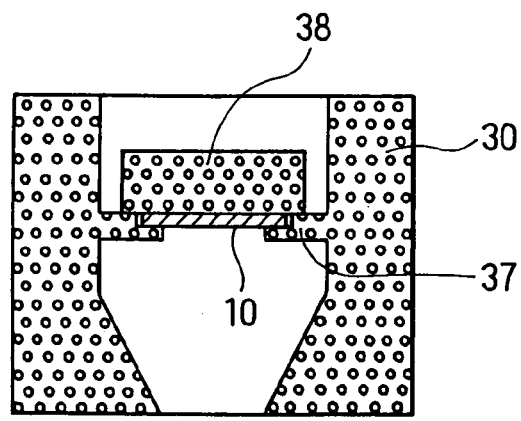
FIGS. 10A and 10B are cross sectional views showing modifications of the CVD apparatus in the second embodiment, respectively.
Figure 10B:
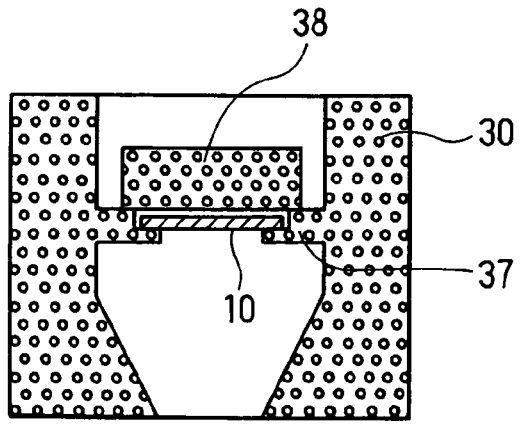

FIGS. 10A and 10B show a modification of the structure, shown in FIG. 4, to hold the SiC substrate 10 in the CVD apparatus.

As shown in FIG. 10A, a substrate holder 37 protrudes from a side face of the susceptor 30 to hold SiC substrate 10. A heat equalizer 38 composed of carbon is disposed on the back surface of the SiC substrate 10 so as to closely contact the back surface of the SiC substrate 10. All portions of the SiC substrate 10 are equally heated up to the temperature of 1750° C. or less by the heat equalizer 38.

As such, by making the heat equalizer 38 contact the back surface of the SiC substrate 10, even if the micro-pipe defect penetrates the SiC substrate 10, the micro-pipe defect is occluded at the front surface of the SiC substrate 10. The sublimation gas sublimed from the vicinity of the back surface of the SiC substrate 10 is apt to move to the front surface of the SiC substrate 10 by epitaxial growth. As a result, the occlusion of the micro-pipe defect occurs.

Moreover, as shown in FIG. 10B, the heat equalizer 38 does not contact the SiC substrate 10 with a space interposed therebetween, but contacts the substrate holder 37. The substrate holder 37 holds an entire periphery of the SiC substrate 10 to form a closed space between the heat equalizer 38 and the SiC substrate 10. Therefore, a pressure due to the closed space is applied to the back surface of the SiC substrate 10 while a decompressed atmosphere exists on the front surface of the SiC substrate 10 to such a degree of, for example, 200 Torr which is low pressure as compared to the back surface.

Incidentally, the heat equalizer 38 may not contact the substrate holder 37, and a narrowed space may be formed between the heat equalizer 38 and the SiC substrate 10 that is only about several mm or less.

Therefore, the sublimation gas sublimed from the vicinity of the back surface of the SiC substrate 10 is apt to move to the front surface of the SiC substrate 10, so that the occlusion of the micro-pipe defect is advanced to the front surface of the SiC substrate 10.

As described above, when the micro-pipe defect is occluded using the temperature difference between the front surface and the back surface of the SiC substrate 10, a pressure difference between the front surface and the back surface of the substrate 10 is generated. In other words, the pressure applied to the front surface is lowered in comparison with the back surface to permit the occlusion of the micro-pipe defect.

Incidentally, although not shown in the figure, the substrate holder 37 has an opening at a portion other than the region to contact the SiC substrate 10 so that the gas flowing into the susceptor 30 from the lower side is exhausted from the upper side of the susceptor 30.

Other methods will be explained.

Preferably, the temperature of the SiC substrate is at 1650° C. or more since sublimation is apt to occur from the SiC substrate at this temperature condition. For further advancing the sublimation, the temperature is at 1750° C. or more, preferably 1800° C. or more.

Incidentally, when the temperature of the SiC substrate exceeds 1900° C., sublimation is preferred rather than recrystallization, so that there is a possibility that the micro-pipe defect cannot be occluded. Therefore, the temperature is preferably set at 1900° C. or less.

However, the temperature can be at 1900° C. or more, for example, approximately at 2250° C. which is a temperature of a seed crystal substrate in the sublimation method when the conditions of the growth rate, the atmosphere in the growth and the like can be suitably set.

Moreover, in terms of cooling the front surface of the SiC substrate, the flow rate of the carrier gas or the gas for the epitaxial growth is preferably set at 1 m/sec or more.

Moreover, the temperature difference between the front surface and the back surface of the SiC substrate is set at 0.5° C. or more, preferably set at 5° C. or more. As such, the sublimation gas from the vicinity of the back surface of the SiC substrate is transferred to the front surface and is apt to be recrystallized through the micro-pipe defect.

Moreover, when the thickness of the SiC substrate is at 300 µm or more, the temperature difference between the front surface and the back surface is apt to be generated.

Moreover, by setting the growth rate of the epitaxial film to be formed on the front surface of the SiC substrate at 20 µm/h or more, preferably 30 µm/h or more, the growth rate toward the lateral direction (a-face growth) approximately perpendicular to the thickness direction of the substrate can be enhanced, so that the micro-pipe defect can be prevented from being absorbed into the epitaxial film.

Incidentally, the present invention is not limited to a substrate for a device but may be employed in a bulk growth by utilizing a benefit that the growth rate of the epitaxial film is fast. In this case, SiC single crystals can be obtained in which micro-pipe defects are eliminated.

Moreover, the SiC substrate, on which the epitaxial layer is grown by the method as described above to occlude the micro-pipe defect, can be employed as a seed crystal for the so-called sublimation method in which SiC source powder or source gases are sublimed to be recrystallized on the seed crystal so as to form a bulk SiC. In this case, sublimed gases are recrystallized on the epitaxial film disposed in a chamber composed of, for example, carbon.

Moreover, although the case where $SiH_4$ gas and $C_3H_8$ gas serve as source gases is described, hydride such as $Si_2H_6$ gas, $C_2H_4$ gas or the like, chloride, sublimation gas of SiC, or Si vapor may be employed as the gas. Furthermore, the growth method is not limited to the CVD method, but can employ a vapor phase deposition method such as molecular epitaxial growth method, sublimation method or the like.

What is claimed is:

1. A manufacturing method of silicon carbide single crystals, comprising the steps of:
   providing a silicon carbide single-crystal substrate having a micro-pipe therein;
   applying temperature difference in a thickness direction of the substrate so that temperature at a front surface of the substrate is lower than that at a back surface of the substrate that is disposed opposite to the front surface; and
   supplying a gas containing at least carbon and a gas containing at least silicon to the front surface to form a silicon carbide film by epitaxial growth;
   wherein the temperature difference is caused by supplying a gas containing at least one of hydrogen and helium to the front surface of the substrate.

2. A manufacturing method of silicon carbide single crystals according to claim 1, wherein temperature of the substrate is set at 1650° C. or more.

3. A manufacturing method of silicon carbide single crystals according to claim 2, wherein the temperature of the substrate is set in a range from 1750 to 1900° C.

4. A manufacturing method of silicon carbide single crystals according to claim 1, wherein flow rate of the gas containing carbon and the gas containing silicon is set at 1 m/sec or more just before reaching the substrate.

5. A manufacturing method of silicon carbide single crystals according to claim 1, wherein the temperature difference is set at 0.5° C. or more.

6. A manufacturing method of silicon carbide single crystals according claim 5, wherein the temperature difference is set at 5° C. or more.

7. A manufacturing method of silicon carbide single crystals according to claim 1, wherein the silicon carbide film includes a film formed by epitaxial growth in which a growth rate is at 20 µm/h or more.

8. A manufacturing method of silicon carbide single crystals according to claim 1, wherein a thickness of the substrate is 300 µm or more.

9. A manufacturing method for forming silicon carbide single crystals according to claim 1, further comprising:
   disposing the silicon carbide substrate on which the silicon carbide film is formed by the epitaxial growth in a chamber as a seed crystal;
   supplying a sublimation gas sublimed from a source material in the chamber; and
   recrystallizing the sublimation gas on the seed crystal.

10. A manufacturing method of silicon carbide single crystals forming a silicon carbide film by epitaxial growth on a silicon carbide substrate having a micro-pipe, comprising the steps of:
    holding said substrate by a holding means;
    setting flow direction of a gas containing carbon and a gas containing silicon in approximately perpendicular to a front surface of the substrate that has an opening of said micro-pipe;

setting flow rate of the gas containing carbon in the gas containing silicon at 1 m/sec or more; and setting temperature of the surface of the substrate in a range of 1750 to 1900° C.;

wherein temperature difference is caused in a thickness direction of the substrate to lower temperature at the front surface of the substrate than at a back surface of the substrate, and wherein said silicon carbide film is formed on the front surface of the silicon carbide substrate by epitaxial growth.

11. A manufacturing method of silicon carbide single crystals according to claim 10, wherein said micro-pipe penetrates the substrate from the front surface to a back surface thereof, and the substrate is held so that the back surface thereof closely contacts a contacting member.

12. A manufacturing method of silicon carbide single crystals according to claim 10, wherein said micro-pipe penetrates the substrate from the front surface to a back surface thereof, and the substrate is held so that pressure of an atmosphere contacting the back surface is high as compared to that of an atmosphere contacting the front surface.

13. A manufacturing method of silicon carbide single crystals according to claim 10, wherein the silicon carbide film is formed by the epitaxial growth in reduced pressure.

14. A manufacturing method for forming silicon carbide single crystals according to claim 10, further comprising:

disposing the silicon carbide substrate on which the silicon carbide film is formed by the epitaxial growth in a chamber as a seed crystal;

supplying a sublimation gas sublimed from a source material in the chamber; and recrystallizing the sublimation gas on the seed crystal.

15. A manufacturing method for forming silicon carbide single crystals on a silicon carbide substrate having a micro-pipe, comprising the steps of:

modifying step for enlarging an opening of the micro-pipe that is disposed at a front surface of the substrate; and film growing step for forming a silicon carbide film by epitaxial growth supplying a gas containing at least carbon and a gas containing at least a silicon to the front surface of the substrate.

16. A manufacturing method for forming silicon carbide single crystals according to claim 15, wherein the substrate is heated up to 1650° C. or more while a carrier gas containing hydrogen flows on the front surface of the silicon carbide substrate in the modifying step.

17. A manufacturing method for forming silicon carbide single crystals according to claim 15, wherein a carrier gas containing chlorine flows on the front surface of the silicon carbide substrate in the modifying step.

18. A manufacturing method for forming silicon carbide single crystals according to claim 15, wherein the silicon carbide substrate is etched using KOH in the modifying step.

19. A manufacturing method for forming silicon carbide single crystals according to claim 15, wherein the opening of the micro-pipe is enlarged so that a diameter thereof becomes twice or more in size as compared to that before enlarged.

20. A manufacturing method for forming silicon carbide single crystals according to claim 15, further comprising:

disposing the silicon carbide substrate on which the silicon carbide film is formed by the epitaxial growth in a chamber as a seed crystal;

supplying a sublimation gas sublimed from a source material in the chamber; and recrystallizing the sublimation gas on the seed crystal.

21. A manufacturing method for forming silicon carbide single crystals according to claim 1, wherein, when the silicon carbide film is formed by the epitaxial growth in the step of supplying the gas, a low resistivity silicon carbide film is at first formed and then a high resistivity silicon carbide film is then formed on the low resistivity silicon carbide film.

22. A manufacturing method for forming silicon carbide single crystals according to claim 10, wherein, when the silicon carbide film is formed by the epitaxial growth in the step of setting the flow direction, a low resistivity silicon carbide film is at first formed and then a high resistivity silicon carbide film is then formed on the low resistivity silicon carbide film.

23. A manufacturing method for forming silicon carbide single crystals according to claim 15, wherein, when the silicon carbide film is formed by the epitaxial growth in the film growing step, a low resistivity silicon carbide film is at first formed and then a high resistivity silicon carbide film is then formed on the low resistivity silicon carbide film.

* * * * *